United States Patent
Azarya et al.

(10) Patent No.: US 11,569,138 B2
(45) Date of Patent: Jan. 31, 2023

(54) SYSTEM AND METHOD FOR MONITORING PARAMETERS OF A SEMICONDUCTOR FACTORY AUTOMATION SYSTEM

(71) Applicant: KLA-Tencor Corporation, Milpitas, CA (US)

(72) Inventors: Mor Azarya, MoshavMerhalj (IL); Michael D. Brain, Los Gatos, CA (US); Ami Appelbaum, Los Gatos, CA (US); Shai Mark, Kibutz Snir (IL); Arie Hoffman, Kiryat Tivon (IL)

(73) Assignee: KLA Corporation, Milpitas, CA (US)

( * ) Notice: Subject to any disclaimer, the term of this patent is extended or adjusted under 35 U.S.C. 154(b) by 43 days.

(21) Appl. No.: 15/048,676

(22) Filed: Feb. 19, 2016

(65) Prior Publication Data
US 2016/0370797 A1  Dec. 22, 2016

Related U.S. Application Data

(60) Provisional application No. 62/180,060, filed on Jun. 16, 2015.

(51) Int. Cl.
  *G05B 19/418* (2006.01)
  *H01L 21/66* (2006.01)
  *H01L 21/67* (2006.01)

(52) U.S. Cl.
  CPC .......... *H01L 22/34* (2013.01); *G05B 19/4184* (2013.01); *H01L 21/67253* (2013.01);
  (Continued)

(58) Field of Classification Search
  CPC ........ G05B 19/418; Y02P 90/02; Y02P 90/14; Y02P 90/18
  See application file for complete search history.

(56) References Cited

U.S. PATENT DOCUMENTS 5,444,637 A  8/1995 Smesny et al.
6,966,235 B1 * 11/2005 Paton ................... G01D 11/245
                                             29/407.05

(Continued)

FOREIGN PATENT DOCUMENTS

CN      101578700 A    11/2009
CN      101632080 A     1/2010
(Continued)

OTHER PUBLICATIONS

Georg Roeder et al., Framework for Integration of Virtual Metrology and Predictive Maintenance, 2012 SEMI Advanced Semiconductor Manufacturing Conference, May 15-17, 2012, pp. 228-293, IEEE, Saratoga, NY.

(Continued)

*Primary Examiner* — Michele Fan
(74) *Attorney, Agent, or Firm* — Suiter Swantz pc llo

(57) ABSTRACT

A system for monitoring one or more conditions of an automation system of a semiconductor factory includes one or more instrumented substrates, one or more sealable containers and one or more system servers. The one or more instrumented substrates include one or more sensors. The one or more sensors measure one or more conditions of the one or more instrumented substrates as the one or more sealable containers transport the one or more instrumented substrates through the semiconductor factory. The one or more sealable containers also receive sensor data from the one or more sensors included on the one or more instrumented substrates. The one or more system servers are configured to receive the sensor data from the one or more sealable containers. The one or more servers are configured to identify one or more deviations in the measured one or more conditions.

25 Claims, 12 Drawing Sheets

(52) U.S. Cl.
CPC .............. *G05B 2219/31372* (2013.01); *G05B 2219/45031* (2013.01); *Y02P 90/02* (2015.11)

(56) References Cited

U.S. PATENT DOCUMENTS

| | | | |
|---|---|---|---|
| 6,970,758 B1* | 11/2005 | Shi | G05B 15/02 700/108 |
| 7,029,930 B2 | 4/2006 | Tomer et al. | |
| 7,085,614 B1* | 8/2006 | Gartland | G05B 19/41865 700/100 |
| 7,135,852 B2* | 11/2006 | Renken | H01L 21/67253 438/5 |
| 7,207,017 B1 | 4/2007 | Tabery et al. | |
| 7,283,255 B2 | 10/2007 | Ramsey et al. | |
| 7,529,642 B2 | 5/2009 | Raymond | |
| 7,750,819 B2 | 7/2010 | Lim | |
| 7,778,793 B2 | 8/2010 | Bonciolini et al. | |
| 8,026,113 B2* | 9/2011 | Kaushal | H01L 21/67253 257/E21.521 |
| 8,104,342 B2 | 1/2012 | Sun et al. | |
| 8,229,587 B2 | 7/2012 | Shieh et al. | |
| 8,432,125 B2 | 4/2013 | Takada et al. | |
| 8,504,620 B2 | 8/2013 | Chi et al. | |
| 8,572,009 B2 | 10/2013 | Harris | |
| 8,682,466 B2 | 3/2014 | Ko et al. | |
| 8,712,571 B2 | 4/2014 | Liu et al. | |
| 8,779,921 B1* | 7/2014 | Curtiss | G08B 25/009 340/506 |
| 8,823,933 B2 | 9/2014 | Bonciolini et al. | |
| 2003/0229410 A1 | 12/2003 | Smith et al. | |
| 2004/0074323 A1 | 4/2004 | Renken | |
| 2005/0086024 A1 | 4/2005 | Seeberger, Jr. et al. | |
| 2005/0246124 A1* | 11/2005 | Tomer | H01L 22/26 702/117 |
| 2005/0246127 A1 | 11/2005 | Renken et al. | |
| 2005/0284535 A1* | 12/2005 | Speasl | H01L 21/67393 141/1 |
| 2006/0234398 A1 | 10/2006 | Gluschenkov et al. | |
| 2008/0087116 A1 | 4/2008 | Rate et al. | |
| 2008/0097646 A1 | 4/2008 | Ramsey et al. | |
| 2009/0015268 A1 | 1/2009 | Gardner et al. | |
| 2009/0101792 A1 | 4/2009 | Bonciolini et al. | |
| 2010/0129940 A1 | 5/2010 | Little | |
| 2011/0035043 A1 | 2/2011 | Liu et al. | |
| 2011/0074341 A1 | 3/2011 | Jensen et al. | |
| 2012/0235793 A1* | 9/2012 | Yi | H01L 21/67294 340/10.1 |
| 2012/0319645 A1* | 12/2012 | O'Donnell | H02J 7/025 320/108 |
| 2013/0335018 A1* | 12/2013 | Ichikawa | B60L 11/182 320/108 |
| 2014/0007669 A1 | 1/2014 | Akada | |
| 2014/0122654 A1 | 5/2014 | Jensen | |
| 2014/0282257 A1* | 9/2014 | Nixon | G05B 11/01 715/835 |
| 2015/0002103 A1* | 1/2015 | Tomiki | H02J 7/0021 320/139 |
| 2015/0006108 A9 | 1/2015 | Renken | |
| 2015/0054347 A1* | 2/2015 | Amano | H04B 5/0087 307/104 |
| 2016/0132046 A1* | 5/2016 | Beoughter | G05B 19/4184 700/17 |

FOREIGN PATENT DOCUMENTS

| | | |
|---|---|---|
| CN | 103946967 A | 7/2014 |
| EP | 1014437 B1 | 9/2008 |
| JP | 2004527899 A | 9/2004 |
| JP | 2005521926 A | 7/2005 |
| JP | 2011253844 A | 12/2011 |
| JP | 2012004490 A | 1/2012 |
| JP | 2012248887 A | 12/2012 |
| KR | 101299858 B1 * | 8/2013 |
| TW | 201125030 A | 7/2011 |
| WO | 2003067183 A2 | 8/2003 |
| WO | 2014070748 A1 | 5/2014 |
| WO | 2015049087 A1 | 4/2015 |

OTHER PUBLICATIONS

Daniel Kurz et al., Monitoring Virtual Metrology Reliability in a Sampling Decision System, 2013 IEEE International Conference on Automation Science and Engineering (CASE), Aug. 17-20, 2013, pp. 20-25, IEEE, Madison, WI.
PCT International Search Report for Application No. PCT/US2016/036751 dated Sep. 12, 2016, 4 pages.
Office Action dated Oct. 9, 2019 for Chinese Patent Application No. 201680032062.8.
Office Action dated Jul. 16, 2020 for Chinese Application No. 201680032062.8.
Office Action dated Jul. 28, 2020 for Japanese Application No. 2017-565247.
Second Office Action in Japanese Application No. 2017-565247 dated Dec. 22, 2020, 8 pages (with English Translation).
Office Action in Taiwanese Application No. 110120150 dated Oct. 1, 2021, 16 pages (No English Translation).

* cited by examiner

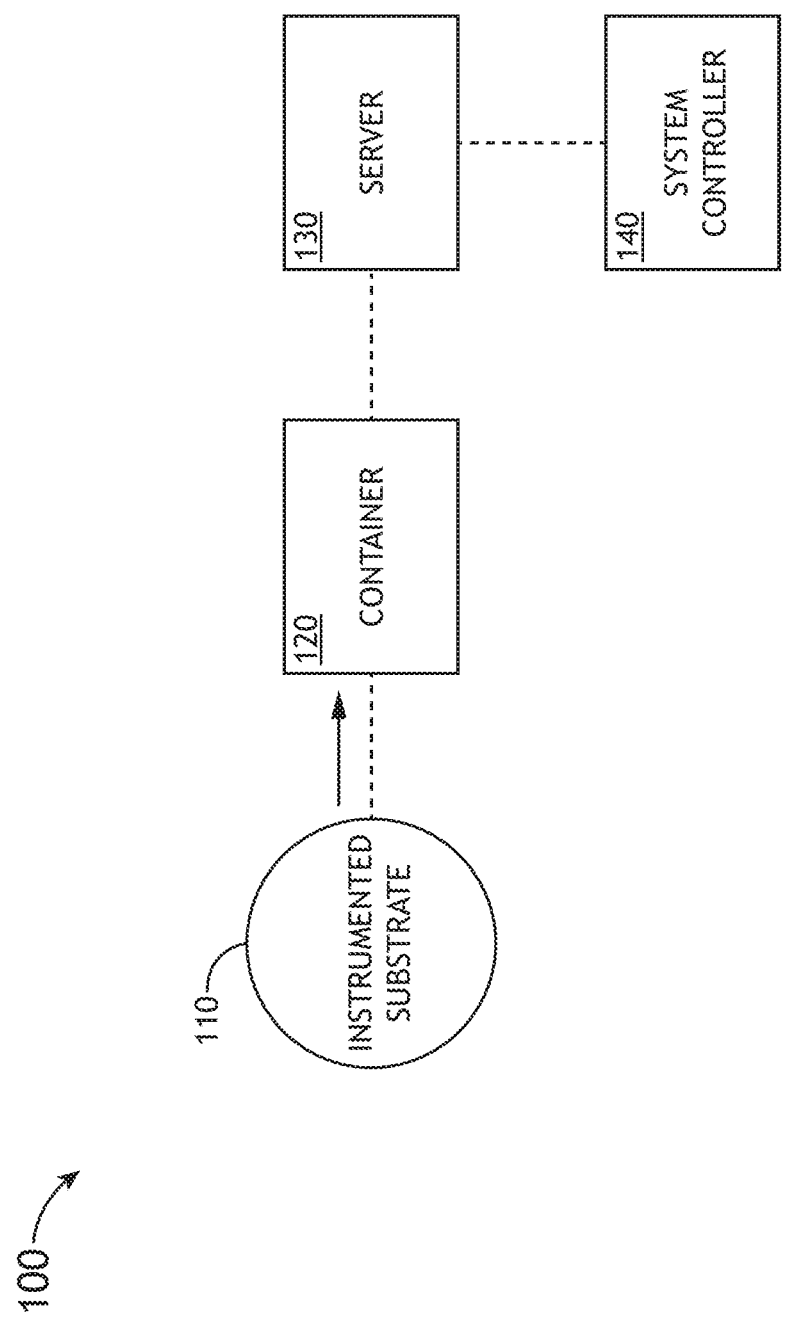

| Step | Recipe | Tools Qualified | Parameter |
|---|---|---|---|
| 1 Instrument | Recipe A | AMSTN-001 | Etcher 1 |
| 2 Etch | Etcher-PM Recipe | Etcher 1 | |
| 3 Instrument | Recipe A | AMSTN-001 | Etcher 2 |
| 4 Etch | Etcher-PM Recipe | Etcher 2 | |
| 5 HOLD | | | |

SYSTEM AND METHOD FOR MONITORING PARAMETERS OF A SEMICONDUCTOR FACTORY AUTOMATION SYSTEM

CROSS-REFERENCE TO RELATED APPLICATION

The present application claims the benefit under 35 U.S.C. § 119(e) of U.S. Provisional Application Ser. No. 62/180,060, filed Jun. 16, 2015, entitled METHOD TO AUTOMATICALLY MEASURE AND MONITOR PARAMETERS SUCH AS THE LEVELING, TEACHING, ALIGNMENT, CLEANLINESS, AND HEALTH OF SEMICONDUCTOR FACTORY AUTOMATION SYSTEMS AND WAFER CHARGER, naming Mor Azarya, Michael D. Brain, Ami Appelbaum, Shai Mark and Arie Hoffman as inventors, which is incorporated herein by reference in the entirety.

TECHNICAL FIELD

The present disclosure relates generally to monitoring conditions of a semiconductor factory automation system, and, more particularly, to an instrumented substrate for monitoring parameters of a semiconductor factory automation system.

BACKGROUND

Process flows in modern semiconductor device fabrication lines utilize a multitude of fabrication steps performed by a series of semiconductor fabrication tools. Process flows may contain more than 800 process steps in a re-entrant flow among a set of semiconductor device fabrication line tools including over one thousand equipment units of over one hundred different types. Wafers in a process flow are typically moved through process steps in sealable containers, or front opening unified pods (FOUPs), by automation systems. Automation systems may include FOUP handling systems, such as automated material handling systems (e.g. overhead transport systems, stockers and the like), and FOUP/wafer handling systems of process and metrology equipment.

Accelerometers are used to measure vibration and manually interpret the data to determine automation system health. Accelerometers are typically used as part of a troubleshooting exercise or an acceptance test for newly installed equipment. Some accelerometer systems are mounted to wafers or other substrates of similar dimensions. Manual identification of errors and deviations in a semiconductor fabrication line automation system is cumbersome and slow, making the identification of the root causes of the errors and deviations in the automation system difficult to identify. Therefore, it would be desirable to provide a system and method for curing defects such as those identified above.

SUMMARY

A system for monitoring one or more conditions of an automation system of a semiconductor factory is disclosed, in accordance with one or more illustrative embodiments of the present disclosure. In one embodiment, the system includes one or more instrumented substrates. In another embodiment, the one or more instrumented substrates include one or more sensors. In another embodiment, the one or more sensors are configured to measure one or more conditions of the one or more instrumented substrates as the one or more instrumented substrates traverses one or more portions of the semiconductor factory. In another embodiment, the one or more instrumented substrates include substrate communication circuitry and one or more processors communicatively coupled to the one or more sensors and the substrate communication circuitry.

In another embodiment, the system includes one or more sealable containers configured to transport the one or more instrumented substrates through the semiconductor factory. In another embodiment, the one or more sealable containers include container communication circuitry. In another embodiment, the container communication circuitry is communicatively couplable to the substrate communication circuitry. In another embodiment, the container communication circuitry is configured to receive sensor data from the one or more sensors of the one or more instrumented substrates via the substrate communication circuitry.

In another embodiment, the system includes one or more system servers. In another embodiment, the one or more system servers include server communication circuitry. In another embodiment, the server communication circuitry is communicatively couplable to the one or more sealable containers. In another embodiment, the server communication circuitry is configured to receive the sensor data from the container communication circuitry. In another embodiment, the one or more system servers are configured to identify one or more deviations in the measured one or more conditions of the one or more instrumented substrates.

A sealable container for transporting one or more substrates through a semiconductor factory is disclosed, in accordance with one or more illustrative embodiments of the present disclosure. In one embodiment, the sealable container includes a housing configured to contain an instrumented substrate. In another embodiment, the instrumented substrate includes one or more sensors. In another embodiment, the one or more sensors are configured to measure one or more conditions of the instrumented substrate as the sealable container transports the instrumented substrate through one or more portions of the semiconductor factory. In another embodiment, the instrumented substrate includes substrate communication circuitry and one or more processors communicatively coupled to the one or more sensors and the substrate communication circuitry. In another embodiment, the sealable container includes container communication circuitry. In another embodiment, the substrate communication circuitry is configured to transmit sensor data from the one or more sensors to the container communication circuitry. In another embodiment, the container communication circuitry is configured to transmit the sensor data to server communication circuitry of a server.

A method for monitoring one or more conditions of an automation system of a semiconductor factory is disclosed, in accordance with one or more illustrative embodiments of the present disclosure. In one embodiment, the method includes transporting an instrumented substrate through one or more portions of a semiconductor fabrication facility in a sealable container. In another embodiment, the method includes measuring one or more conditions of the instrumented substrate at one or more locations within the semiconductor fabrication facility. In another embodiment, the method includes transmitting the measured one or more conditions from the instrumented substrate to the sealable container. In another embodiment, the method includes transmitting the measured one or more conditions from the sealable container to a system server. In another embodiment, the method includes identifying one or more deviations in the measured one or more conditions with the system server.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 1A is a conceptual view of the system for measuring one or more conditions of a semiconductor automation system, in accordance with one or more embodiments of the present disclosure.

FIG. 4B is a graphical view of an example report transmitted to a user indicative of the various steps and targeted tools of a measurement mission, in accordance with one or more embodiments of the present disclosure.

DETAILED DESCRIPTION

Figure 1B:
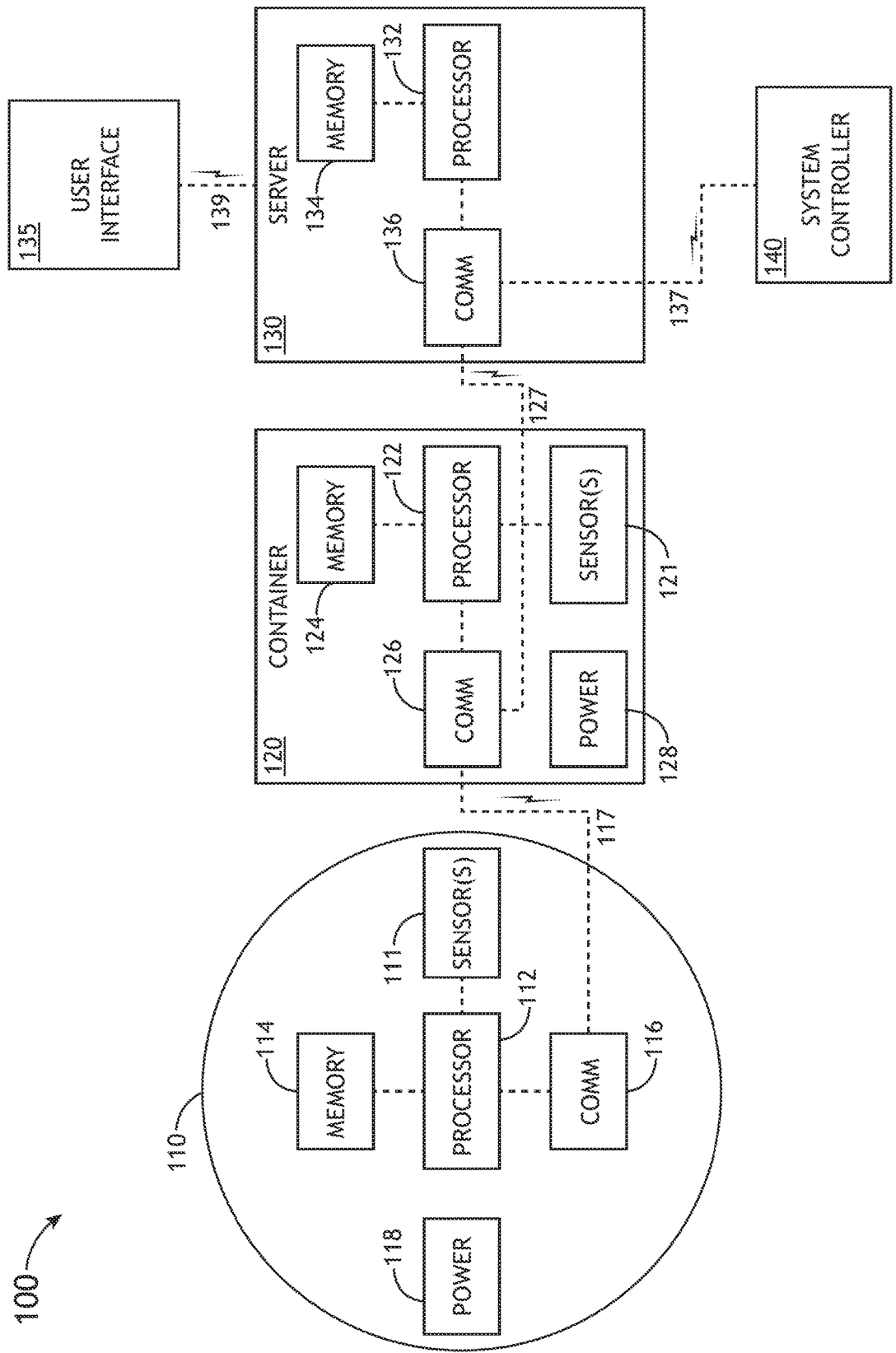
FIG. 1B is a block diagram view of the system for measuring one or more conditions of a semiconductor automation system, in accordance with one or more embodiments of the present disclosure.

Reference will now be made in detail to the subject matter disclosed, which is illustrated in the accompanying drawings.

Referring generally to FIGS. 1A through 4B, a system and method for monitoring one or more conditions of a semiconductor automation system is described, in accordance with one or more embodiments of the present disclosure. Embodiments of the present disclosure are directed to the automatic measurement and/or monitoring of one or more parameters and/or conditions of automation systems of a semiconductor factory, or fabrication line. For instance, parameters and/or conditions measured and/or monitored by the embodiments of the present disclosure may include, but are not limited to, leveling, teaching, alignment, cleanliness, pressure and/or the health of the automation system(s). Such automation systems may include, but are not limited to, automated material handling systems (e.g., overhead transport system, stocker and the like) and FOUP/wafer handling systems of process and metrology equipment. The automated measurement and/or monitoring approach provided by the various embodiments of the present disclosure provide actionable results and trends that aid in identifying the root cause(s) of an error or deviation in the operation of one or more portions of a semiconductor factory automation system.

A device for measuring process conditions in a semiconductor manufacturing facility is discussed in U.S. Pat. No. 8,104,342, issued on Jan. 31, 2012, which is incorporated herein by reference in the entirety. An interface system and a sensor wafer are discussed in U.S. Patent Pub. No. 2011/0074341, published on Mar. 31, 2011, which is incorporated herein by reference in the entirety. An interface system for use in a semiconductor handling system is discussed in U.S. Patent Pub. No. 2014/0122654, published on May 1, 2015, which is incorporated herein by reference in the entirety.

FIG. 1A illustrates a conceptual block diagram view of system 100 for measuring one or more conditions of a semiconductor automation system, in accordance with one or more embodiments of the present disclosure.

In one embodiment, the system 100 includes one or more instrumented substrates 110. For example, the one or more instrumented substrates 110 may include, but are not limited to, one or more instrumented semiconductor wafers 110. In another embodiment, the system 100 includes one or more sealable containers 120. In one embodiment, the one or more sealable containers 120 are configured to receive and secure the one or more instrumented substrates 110. The instrumented substrate 110 is configured to measure one or more conditions of the instrumented substrate 110 as the sealable container 120 containing the instrumented substrate 110 travels through the semiconductor automation system. The one or more instrumented wafers 110 may be communicatively coupled (e.g., wireless or wireline coupling) with the one or more sealable containers 120. In one embodiment, the conditions measured by the one or more instrumented wafers 110 may be stored on the one or more instrumented substrates 110 and then transferred to the one or more sealable containers 120. For example, the instrumented wafer 110 may be placed into a sealable container 120 to observe the vibrations and/or other conditions that are experienced by a product wafer as it moves through the sealable container transport and storage system, and then as it moves through the wafer handling systems associated with operations such as, but not limited to, process, metrology, sorting, transportation, storage, and shipping.

In another embodiment, the system 100 includes a server 130. In one embodiment, the server 130 is communicatively coupled (e.g., wireless or wireline coupling) to the one or more sealable containers 120. In this regard, the conditions measured by the one or more instrumented wafers 110 may be stored on the one or more instrumented substrates 110 and then transferred to the one or more sealable containers 120. In turn, the one or more sealable containers 120 may transfer the measured conditions to server 130. In this sense, the one or more sealable containers 120 may act to extend the capabilities of the one or more instrumented wafers 110. For instance, the one or more sealable containers 120 may include memory to buffer sensor data from the instrumented substrate 110 and a power source to recharge the instrumented substrate 110. In addition, the one or more sealable containers 120 may include additional sensors for providing additional container sensor data concerning location, activity and status. The one or more sealable containers 120 may also include one or more processors that may provide additional processing power to analyze the acquired sensor data. For example, the one or more sealable containers 120 may manage data acquisition or serve as a data buffer, whereby the one or more measured conditions from the one or more instrumented substrates 110 are stored by the one or more sealable containers 120 until the data can be transferred to the server 130. By way of another example, the one or more sealable containers 120 may serve as a transmission repeater, whereby the one or more measured conditions from the one or more instrumented substrates 110 immediately (or nearly immediately) transfers the received one or more measured conditions from the one or more instrumented substrates 110 to the server 130. In another embodiment, the conditions measured by the one or more instrumented wafers 110 may be stored on the one or more instrumented substrates 110 and then transferred directly to the server 130 at a later time. In this regard, the measured conditions may be buffered on the one or more instrumented substrates 110 and transferred to the server 130 at a later time.

In another embodiment, the server 130 may receive and analyze the one or more measured conditions. For example, the server 130 may analyze the one or more conditions measured by the instrumented substrate 110 in order to identify one or more deviations in the one or more conditions measured by the one or more instrumented substrates 110.

In another embodiment, the system 100 includes a system controller 140. The system controller 140 may be communicatively coupled to the server 130. In one embodiment, upon completion of the analysis of the measurement one or more conditions from the one or more instrumented substrates 110, the server 130 transmits the analyzed data to a system controller 140. The system controller 140 may include, but is not limited to, a manufacturing execution system (MES).

FIG. 1B illustrates a block diagram view of system 100 for measuring one or more conditions of a semiconductor automation system, in accordance with one or more embodiments of the present disclosure.

Figure 1C:
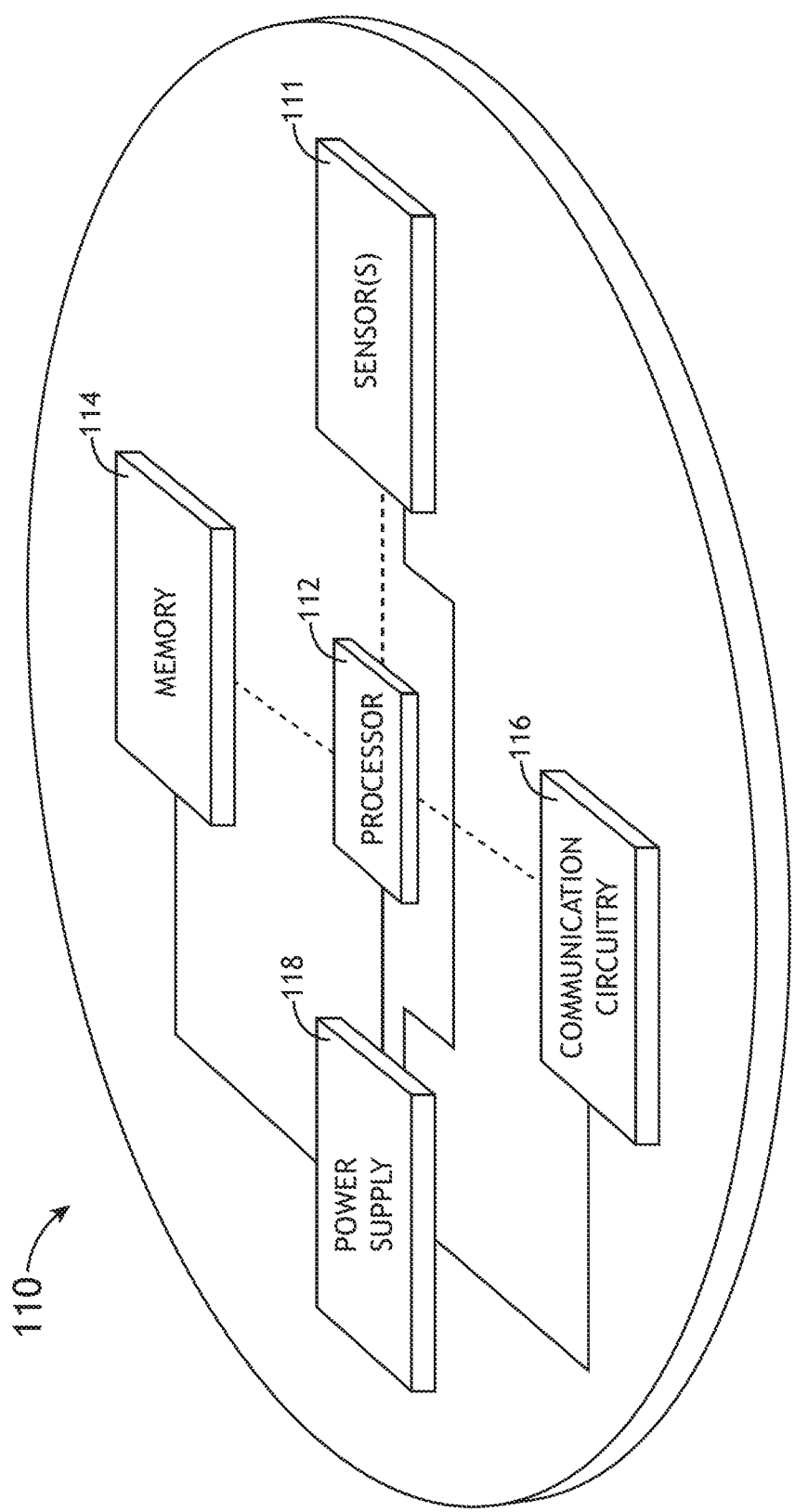
FIG. 1C is a schematic view of an instrumented substrate, in accordance with one or more embodiments of the present disclosure.

In one embodiment, the instrumented substrate 110 includes one or more sensors 111 and support circuitry. The support circuitry may include, but is not limited to, one or more processors (e.g., microprocessor), memory 114, communication circuitry 116 and/or a power supply circuitry 118. FIG. 1C illustrates a simplified schematic view of the instrumented substrate 110, in accordance with one embodiment of the present disclosure. In one embodiment, as shown in FIG. 1C, the one or more sensors 111 and support circuitry of the instrumented substrate 110 are disposed on the surface of the substrate 110. In another embodiment, the one or more sensors 111 and the support circuitry of the instrumented substrate 110 are disposed within the substrate 110 (e.g., disposed within a cavity of the substrate 110).

The one or more sensors 111 of the instrument substrate 110 may include any sensor known in the art suitable for measuring one or more conditions of the instrumented substrate 110 as it passes through a semiconductor automation system. In one embodiment, the one or more sensors 111 include one or more motion sensors. For example, the one or more sensors 111 may include, but are not limited to, a triaxial accelerometer, magnetometer, and/or gyroscope. In another embodiment, the one or more sensors 111 include one or more additional sensors. For example, the one or more sensors 111 include, but are not limited to, a sensor for measuring contamination levels, a humidity sensor for measuring humidity, a gas sensor for measuring the presence of selected gases, a chemical sensor for measuring the presence of selected compounds/chemicals, a temperature sensor for measuring temperature, a pressure sensor for measuring pressure and/or an audio sensor for measuring sound levels. It is noted that the list of sensors provided above is not limiting and is provided merely for illustrative purposes.

Referring again to FIG. 1B, in one embodiment, the one or more sealable containers 120 include one or more processors 122, memory 124, communication circuitry 126, one or more sensors 121 and/or power supply circuitry 128. As noted previously herein, the one or more processors 122, memory 124, communication circuitry 126, one or more sensors 121 and/or power supply circuitry 128 of the one or more sealable containers 120 may be used to expand the capabilities of the one or The one or more sensors 121 of the sealable container 120 may serve to measure and monitor various conditions of the sealable container 120 and/or the instrumented wafer 110 contained within the sealable container 120. For example, the one or more sensors 121 of the sealable container 120 measure motion (e.g., acceleration, rotational velocity, and the like) associated with the transport of the sealable container 120, which allows the system 100 to locate the sealable container 120 and the instrumented substrate 110 in a semiconductor fabrication automation system.

The one or more sensors 121 of the sealable container 120 may include any sensor known in the art suitable for measuring one or more conditions within the sealable container 120 as it passes through a semiconductor automation system. In one embodiment, the one or more sensors 121 include one or more motion sensors. For example, the one or more sensors 121 may include, but are not limited to, a triaxial accelerometer, magnetometer, and/or gyroscope. In another embodiment, the one or more sensors 121 include one or more additional sensors. For example, the one or more sensors 121 include, but are not limited to, a sensor for measuring contamination levels, a humidity sensor for measuring humidity, a gas sensor for measuring the presence of selected gases, a chemical sensor for measuring the presence of selected compounds/chemicals, a temperature sensor for measuring temperature, a pressure sensor for measuring pressure and/or an audio sensor for measuring sound levels.

It is noted that the list of sensors provided above is not limiting and is provided merely for illustrative purposes.

The one or more processors 112, 122 and 132 of the instrumented substrate 110, the sealable container 120 and/or the server 130 may include any one or more processing elements known in the art. In this sense, the one or more processors may include any microprocessor-type device configured to execute software algorithms and/or program instructions. It should be recognized that the data processing steps described throughout the present disclosure may be carried out by anyone of the processors 112, 122 and 132. In general, the term "processor" may be broadly defined to encompass any device having one or more processing or logic elements, which execute program instructions from a non-transitory memory medium (e.g., memory 114, 124 and/or 134). Moreover, different subsystems of the system 100 may include processor or logic elements suitable for carrying out at least a portion of the steps described throughout the present disclosure. Therefore, the above description should not be interpreted as a limitation on the present invention but merely an illustration.

The memory 114, 124 and 134 of the instrumented substrate 110, the sealable container 120 and the server 130 may include any data storage medium known in the art suitable for storing program instructions executable by the associated one or more processors. For example, the memory 114, 124 and/or 134 may include a non-transitory memory medium. For instance, the memory may include, but is not limited to, a read-only memory, a random access memory, a magnetic or optical memory device (e.g., disk), a magnetic tape, a solid state drive and the like. In another embodiment, it is noted herein that the memory is configured to store one or more results from the system 100 and/or the output of the various steps described herein. In another embodiment, the memory 114, 124 and/or 134 store the program instructions for causing the one or more associated processors to carry out various data processing steps described through the present disclosure.

In one embodiment, a communication link is established between the communication circuitry 116 of the instrumented substrate 110 and the communication circuitry 126 of sealable container 120. For example, one or more data signals 117 indicative of the one or more conditions measured by the one or more sensors 111 of the instrumented substrate 110 are transmitted via substrate communication circuitry 116 to the container communication circuitry 126. The sealable container 120 may then transfer one or more additional data signals 127 indicative of the sensor data having been stored in the container 120 to the server 130 via the communication link between container communication circuitry 126 and server communication circuitry 136.

In one embodiment, the communication link between the instrumented wafer 110 and the sealable container 120 is established via a wireless connection. Any wireless communication protocol known in the art may be used to establish the communication link between the instrumented wafer 110 and the sealable container 120. For example, the communication circuitry 116 (e.g., transmitter and receiver) of the substrate 110 and the communication circuitry 126 (e.g., transmitter and receiver) of the container 120 may be configured to establish a radio frequency (RF) data link. For instance, the RF data link between the instrumented substrate 110 and the container 120 may include a short range RF communication protocol, such as, but not limited to, BLUETOOTH (e.g., LOW ENERGY BLUETOOTH), WIFI, or a customized inductively coupled communication link. By way of another example, the communication circuitry 116 of the substrate 110 and the communication circuitry 126 of the container 120 may be configured to establish an infrared data link.

In another embodiment, the communication link between the instrumented substrate 110 and the sealable container 120 is established via a transmission line connection. Any transmission line technology known in the art may be used to establish the communication link 117 between the instrumented wafer 110 and the sealable container 120. For instance, the transmission line may include, but is not limited to, a wireline connection (e.g., TCP/IP) or a fiberline connection (e.g., fiber bundle). In addition, in the case of a transmission line connection, the instrumented substrate 110 and the container 120 may each be equipped with corresponding input-output ports to allow for the direct connection between communication circuitry 116 and 126.

In another embodiment, the communication link between the sealable container 120 and the communication circuitry 136 of the server 130 is established via a wireless connection. Any wireless communication protocol known in the art may be used to establish the communication link between the sealable container 120 and the server 130. For example, the communication circuitry 126 (e.g., transmitter and receiver) of the sealable container 120 and the communication circuitry 136 (e.g., transmitter and receiver) of the server 130 may be configured to establish a radio frequency (RF) data link. For instance, the RF data link between the instrumented substrate 110 and the container 120 may include a RF communication protocol, such as, but not limited to, WIFI, BLUETOOTH, cellular data link or a customized inductively coupled communication link. By way of another example, the communication circuitry 126 of the sealable container 120 and the communication circuitry 136 of the server 130 may be configured to establish an infrared data link.

In another embodiment, the communication link between the sealable container 120 and the server 130 is established via a transmission line connection. Any transmission line technology known in the art may be used to establish the communication link between the sealable container 120 and the server 130. For instance, the transmission line may include, but is not limited to, a wireline connection (e.g., TCP/IP) or a fiberline connection (e.g., fiber bundle). In addition, in the case of a transmission line connection, the sealable container 120 and the server 130 may each be equipped with corresponding input-output ports to allow for the direct connection between communication circuitry 126 and 136.

In another embodiment, the system 100 includes a user interface 135 communicatively coupled to server 130 via datalink 139. In one embodiment, the user interface 135 is communicatively coupled to the one or more processors 132 of server 130. In another embodiment, the user interface device 135 may be utilized by the server 130 to accept selections and/or instructions from a user, discussed further herein. In some embodiments, described further herein, a display may be used to display data to a user (not shown). In turn, a user may input, via user input device (not shown), a selection and/or instructions responsive to data displayed to the user via the display device.

The user interface device 135 may include any user interface known in the art. For example, the user input device of the user interface 135 may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device or the like.

In the case of a touchscreen interface device, those skilled in the art should recognize that a large number of touchscreen interface devices may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present invention. In another embodiment, the user input device may include, but is not limited to, a bezel mounted interface.

The display device may include any display device known in the art. In one embodiment, the display device may include, but is not limited to, a liquid crystal display (LCD). In another embodiment, the display device may include, but is not limited to, an organic light-emitting diode (OLED) based display. In another embodiment, the display device may include, but is not limited to a CRT display. Those skilled in the art should recognize that a variety of display devices may be suitable for implementation in the present disclosure and the particular choice of display device may depend on a variety of factors, including, but not limited to, form factor, cost, and the like. In a general sense, any display device capable of integration with a user input device (e.g., touchscreen of tablet, bezel mounted interface, keyboard, mouse, trackpad, and the like) is suitable for implementation in the present disclosure.

Figure 1D:
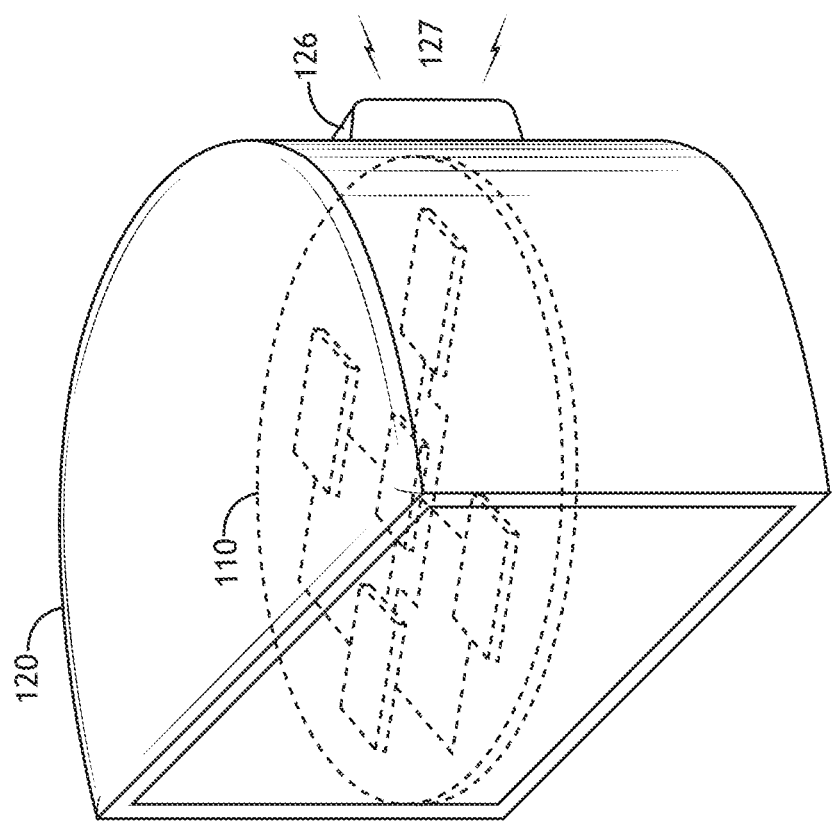
FIG. 1D is a schematic view of an instrumented substrate inserted into a sealable container, in accordance with one or more embodiments of the present disclosure.
Figure 1D:
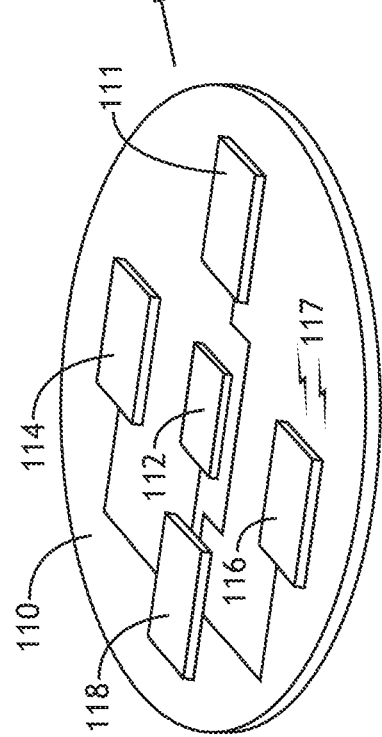

FIG. 1D illustrates a simplified schematic view 150 depicting the insertion of the instrumented substrate 110 into the sealable container 120, in accordance with one embodiment of the present disclosure. In one embodiment, the sealable container 120 includes a front opening unified pod (FOUP). The contents of the sealable container 120 are accessible to the fabrication line tools (not shown in FIGS. 1A-1B) of the semiconductor automation system for processing. As shown in FIG. 1D, the sealable container 120 may receive and secure the instrumented substrate 110 within the housing of the sealable container 120. As noted previously herein, one or more data signals indicative of the one or more conditions measured by the one or more sensors 111 of the instrumented substrate 110 are transmitted via substrate communication circuitry 116 to the container communication circuitry 126 along datalink 117. The sealable container 120 may then transfer one or more additional data signals indicative of the sensor data having been stored in the container 120 to the server 130 via container communication circuitry 126. In another embodiment, upon measuring one or more conditions of the sealable container 120 with the container sensors 121, the sealable container 120 may then transfer one or more additional data signals acquired from the sealable container sensors 121 to the server 130 via container communication circuitry 126.

Referring again to FIG. 1B, in one embodiment, the instrumented substrate 110 includes power supply circuitry 118. The power supply circuitry 118 may supply power to the one or more sensors 111 and support circuitry (e.g., one or more processors 112, memory 114 and/or communication circuitry 116) of the instrumented substrate 110. In one embodiment, the power supply circuitry 118 includes one or more rechargeable batteries. In another embodiment, the power supply circuitry 118 includes one or more replaceable batteries. In another embodiment, in the case of a rechargeable battery, the instrumented wafer 110 may include a wireless battery charger, whereby the wireless battery charger receives energy remotely from an external source and then, in turn, charges the one or more rechargeable batteries.

In another embodiment, the sealable container 120 includes power supply circuitry 128. The power supply circuitry 128 of the sealable container 120 may supply power to the instrumented wafer 110 contained within the sealable container (see FIG. 1D). As described in greater detail further herein, electrical energy may be transferred from a power source of the sealable container 120 via a direct connection (e.g., copper wire) or by inductive coupling. In one embodiment, the power supply circuitry 128 of the sealable container 120 includes one or more replaceable batteries. In one embodiment, the power supply circuitry 128 of the sealable container 120 includes one or more rechargeable batteries.

Figure 1E:
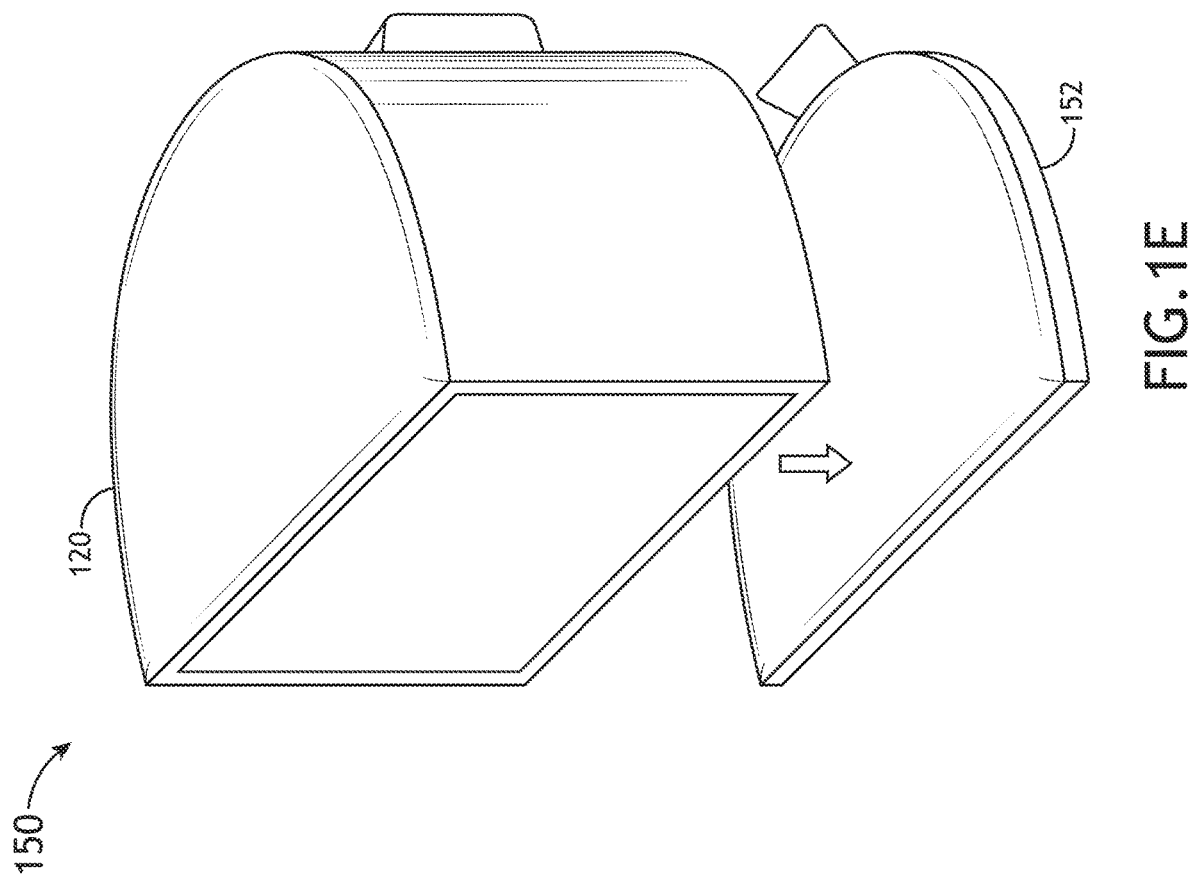
FIG. 1E is a schematic view of a sealable container charged by a charging station, in accordance with one or more embodiments of the present disclosure.

FIG. 1E illustrates a schematic view 150 of a recharging station 152 for recharging one or more rechargeable batteries of the sealable container 120. In one embodiment, the recharging station 152 wirelessly supplies electrical power to the sealable container 120. In another embodiment, in the case where the sealable container 120 includes one or more rechargeable batteries, the sealable container 120 includes a wireless battery charger, whereby the wireless battery charger receives energy remotely from the charging station 152 and then, in turn, charges the one or more rechargeable batteries of the sealable container 120. For example, the sealable container 120 may include one or more RF receiving coils (not shown), whereby the energy is inductively transferred from one or more RF transmission coils of the charging station 152 and then, in turn, energy collected by the one or more RF receiving coils charges the one or more rechargeable batteries of the sealable container 120.

The system 100 may include any number of charging stations 152 and may be located at any position throughout the semiconductor automation system. For example, one or more charging stations 152 may be located at or near any OHT accessible location (e.g., stockers, buffers, under-track storage, load-ports and etc.). In another embodiment, the charging station 152 is equipped with communication circuitry (not shown in FIG. 1E). For example, the communication circuitry of the charging station may transfer sensor data from the memory 124 of the sealable container 120 or the memory of the instrumented substrate 110 via communication circuitry 126 or 116 respectively. Further, the datalink established between the communication circuitry 126 of the sealable container 120 and/or the communication circuitry 116 of the instrumented substrate 110 may be established via a wireless (e.g., WIFI, BLUETOOTH and the like) or transmission line (e.g., TCP/IP or fiberline) connection.

Figure 1G:
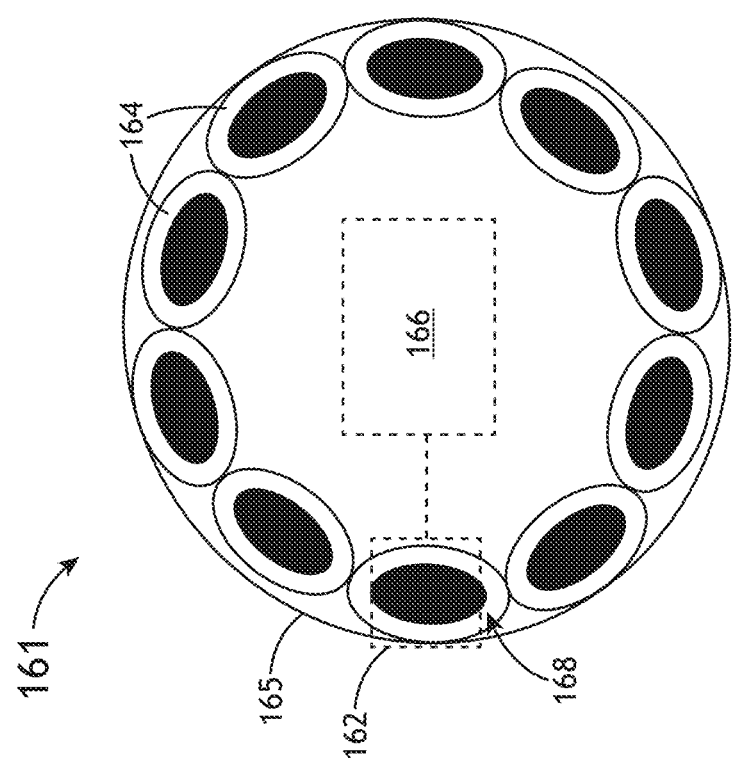
FIG. 1G is a schematic view of an external power transfer device for remotely transferring power or data to the instrumented substrate, in accordance with one or more embodiments of the present disclosure.
Figure 1F:
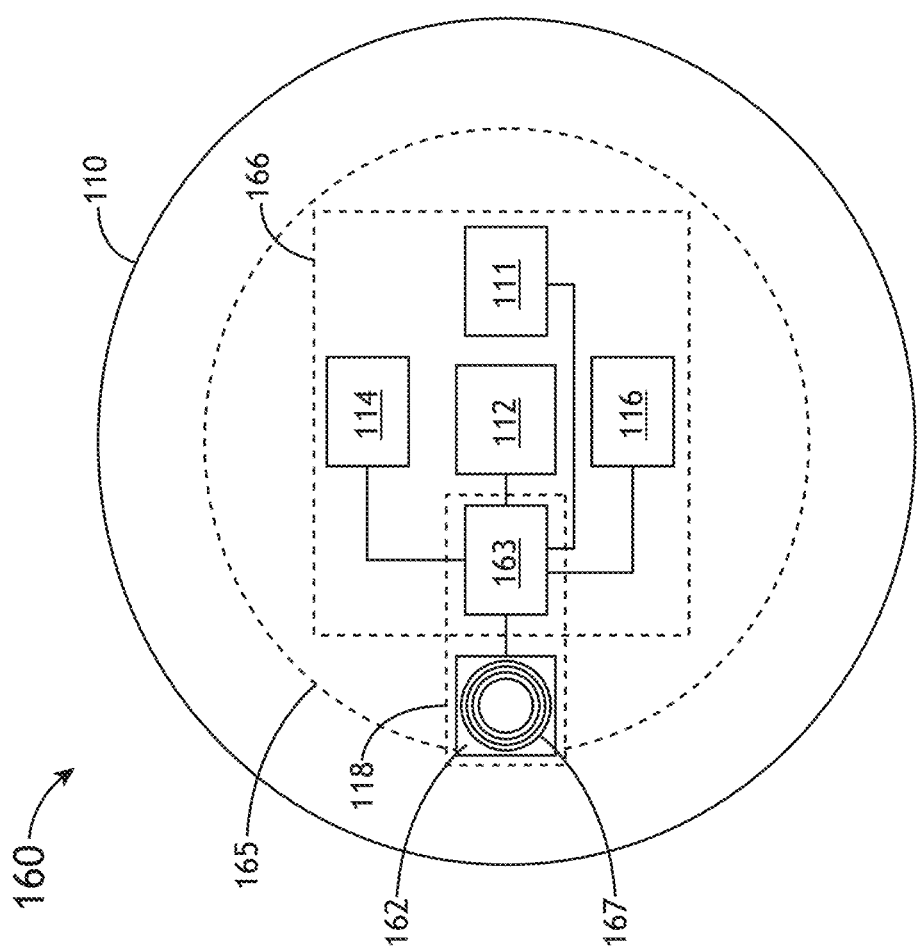
FIG. 1F is a schematic view of an instrumented substrate equipped with a radio frequency receiving coil for charging a rechargeable battery of the instrumented substrate, in accordance with one or more embodiments of the present disclosure.

FIG. 1F illustrates a simplified schematic view 160 of the instrumented wafer 110 equipped with a wireless charger 162 and one or more rechargeable batteries 163 electrically coupled to the wireless charger 162. For example, the wireless battery charger 162 may include one or more RF coils 167, which may inductively receive energy from an external power transfer device or devices. In turn, electrical energy may be transferred to one or more rechargeable batteries 163, which then power the other various electronic components 166 of the instrumented substrate 110.

FIG. 1G illustrates a simplified schematic view 161 of an external power transfer device 165 suitable for transferring power to one or more RF receiving coils 167 of the instrumented substrate 110. In one embodiment, the external power transfer device 165 includes a set of RF transmission coils 164, which serve to inductively transfer power from the external power transfer device 165 to the RF receiving coil 167 of the wireless battery charger 162 of the instrumented wafer 110.

In one embodiment, the external power transfer device 165 may be located at a position below the instrumented wafer 110, allowing the external power transfer device 165 to inductively transfer power to the wireless battery charger 162 disposed on or within the instrumented substrate 110. In another embodiment, the external power transfer device 165 may be located at a position above the instrumented wafer 110. The closer the transmission coil 164 is to the RF receiving coil 167 of the wireless battery charger 162 the better the inductive coupling. For example, the distance between an RF transmission coil 164 and the RF receiving coil 167 of the wireless battery charger 162 may be less than 10 mm.

In another embodiment, the set of RF transmission coils 164 are arranged in a circular array about the perimeter of the external power transfer device 165. It is noted that the RF receiving coil 167 of the wireless battery charger 162 should be aligned with one or more of the RF transmission coils 164 so to direct the magnetic field to establish sufficient coupling and efficient power transfer. Such an aligned arrangement is depicted in FIG. 1G. For example, a single transmission coil 164 may be used to transfer power from the external power transfer device 165 to the RF receiving coil 167 of the wireless battery charger 162 of the instrumented wafer 110. For instance, the RF transmission coil used to transfer power may be the RF transmission coil 168 that is best aligned with the RF receiving coil 167 of the wireless battery charger 162.

Figure 1H:
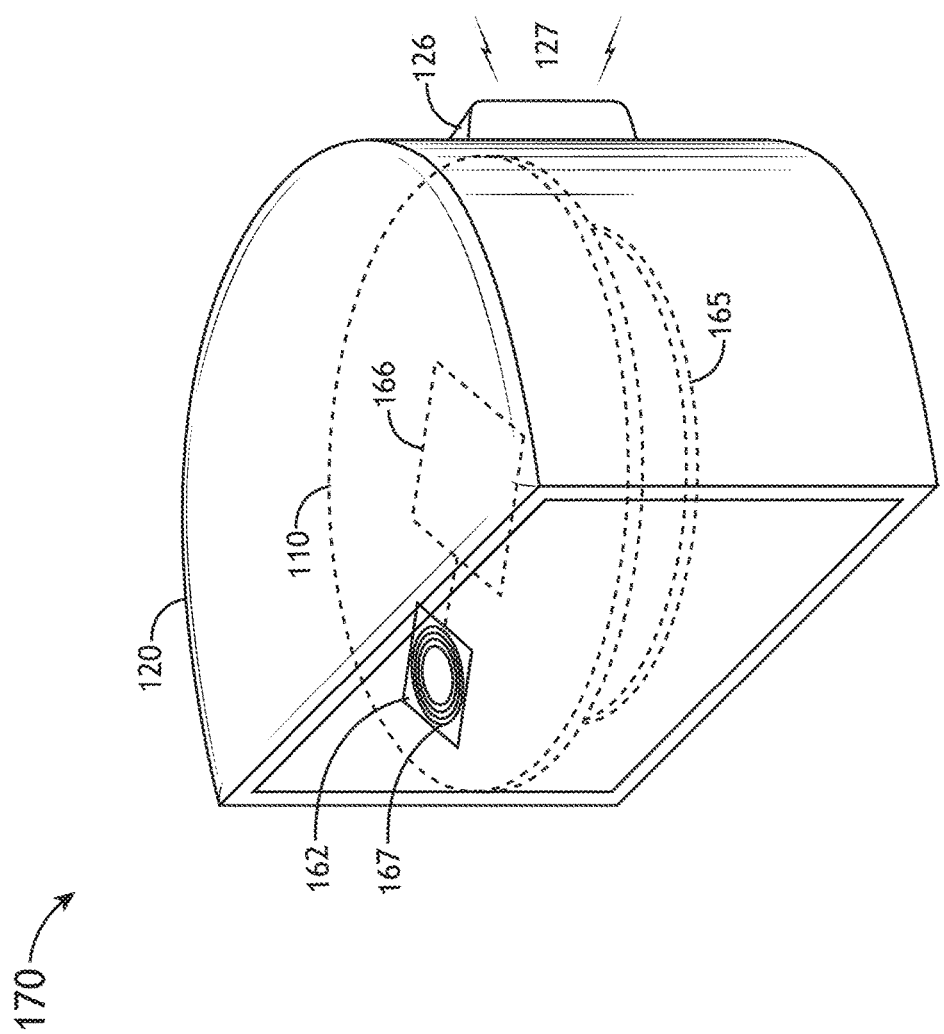
FIG. 1H is a schematic view of the external power transfer device and the instrumented substrate contained within the sealable container, in accordance with one or more embodiments of the present disclosure.

FIG. 1H illustrates a simplified schematic view 170 of the external power transfer device 165 disposed within the sealable container 120, in accordance with one embodiment of the present disclose. In one embodiment, the external power transfer device 165 is disposed within the sealable container 120 and below the instrumented wafer 110. For purposes of simplicity, only the wireless battery charger 162 and the RF receiving coil 167 are depicted on the instrumented wafer 110 in FIG. 1H.

In another embodiment, although not shown, the external power transfer device 165 may be coupled to power supply circuitry 128 (shown in FIG. 1B) in the sealable container 120. In this regard, the power supply circuitry 128 of the sealable container 120 may supply power to the external transfer device 165, which, in turn, transmits power to the RF receiving coil 167 of the instrumented wafer 110.

Figure 1I:
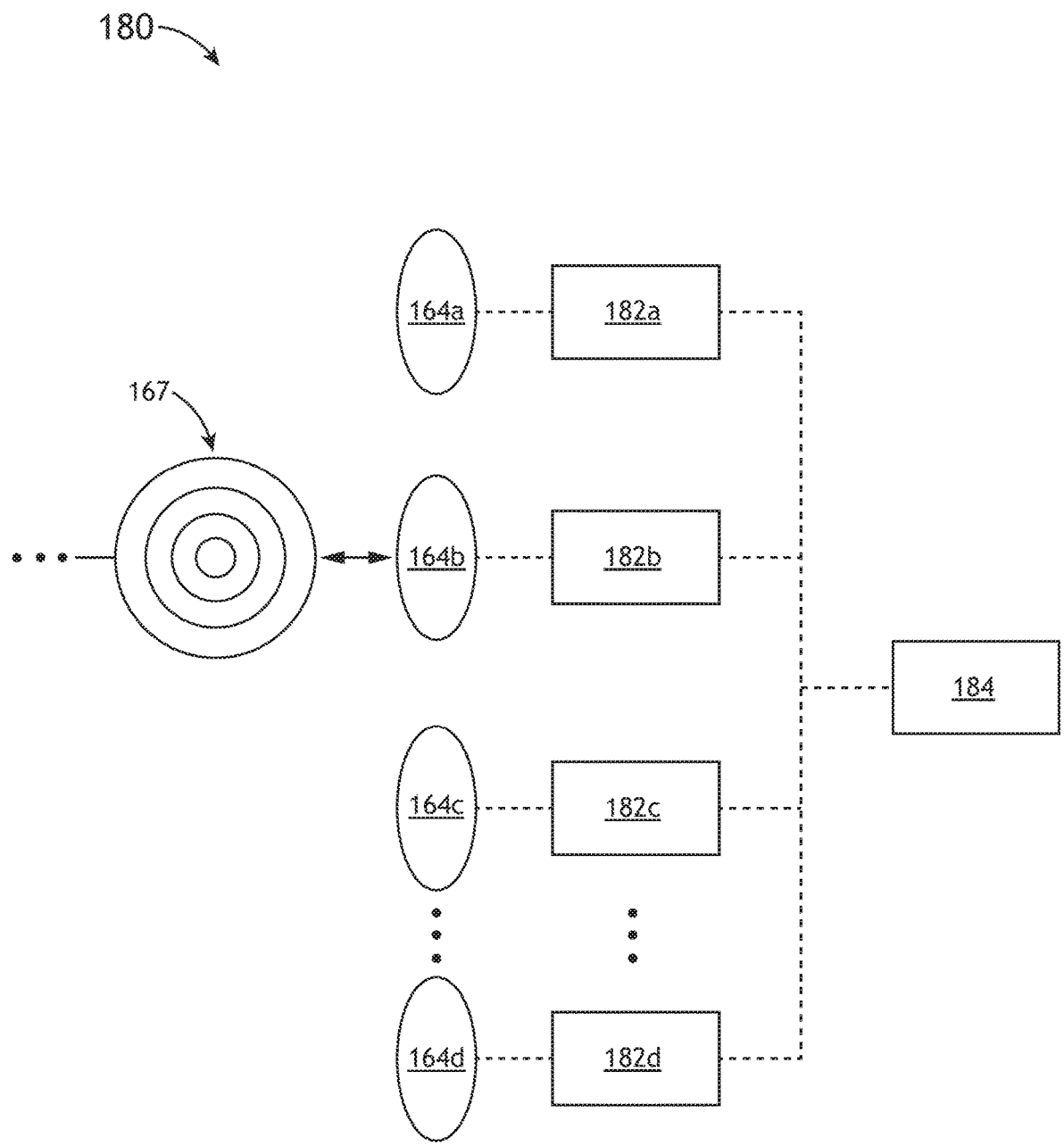
FIG. 1I is a block diagram view of an external power transfer device inductively transferring power to the instrumented substrate, in accordance with one or more embodiments of the present disclosure.

FIG. 1I illustrates a block diagram view 180 of the power transfer from a transmission coil of the external power transfer device 165 to the RF receiving coil 167, in accordance with one embodiment of the present disclosure. In one embodiment, each transmission coil 164a-164d (or group of three transmission coils) is controlled by one of the coil controllers 182a-182d (e.g., integrated circuit power controller). In another embodiment, each controller 182a-182d periodically "pings" its corresponding transmission coil 164a-164d and looks for an inductive load on the corresponding transmission coil 164a-164d. The presence of such an inductive load indicates magnetic coupling between one of the transmission coils 164a-164d and the RF receiving coil 167 of the instrumented wafer 110. In the case where such an inductive load is present on one of the transmission coils 164a-164d, the controller begins power delivery to the RF receiving coil 167 via the transmission coil (e.g., 164b) indicated as experiencing the inductive load.

In another embodiment, control circuitry 184 is communicatively coupled to the coil controllers 182a-182d and is configured to control each of the controllers 182a-182d. In one embodiment, the control circuitry 184 activates the controllers 182a-182d one at a time such that the best aligned transmission coil is selected for the power delivery. For example, the control circuitry 184 may include, but is not limited to, a field programmable gate array (FPGA). In another embodiment, the control circuitry 184 is communicatively coupled to one or more portions of the instrumented wafer 110 (e.g., one or more sensors 111) or one or more portions of the sealable container 120 (e.g., USB channel).

In another embodiment, an active coil controller (e.g., 182b in FIG. 1) may monitor input power, losses, and/or the value of power reported by the RF receiving coil 167. Based on this information, the active controller may then estimate how much power is unaccounted for and the presumed lost due to metal objects placed in the wireless power transfer path. In the event that this unexpected loss exceeds a selected threshold, a fault is reported and power transfer is halted.

In another embodiment, the external power transfer device 165 and/or the instrumented substrate 110 includes shielding portions. For example, magnetic shielding material/elements may be added as a backing to the one or more transmission coils 164 of the external power transfer device 165 and/or the RF receiving coil 167 of the instrumented substrate 110. The shielding serves to direct the magnetic field to the coupled zone. As such, any magnetic field outside the coupled zone does not transfer power. Thus, shielding also serves to contain the fields to avoid coupling to other adjacent system components.

It is noted that the configuration of the external power transfer device 165 is not limited to the arrangement described above and depicted in FIG. 1G, which are provided merely for illustrative purposes. It is recognized herein that any number of transmission coils and any arrangement of transmission coils may be used in the external power transfer device 165.

For example, the arrangement of transmission coils 164 may take on any geometrical arrangement known in the art. For instance, the arrangement may include a circular array, an ellipsoidal array, a polygonal array, a rectangular array, one or more linear arrays and the like. Further, it is noted that the configuration of the receiving coil 167 is not limited to the arrangement described above and depicted in FIG. 1F, which are provided merely for illustrative purposes. It is recognized herein that any number of receiving coils and any arrangement of the receiving coil or coils may be used on the instrumented substrate 110. For instance, the instrumented substrate 110 may include two or more receiving coils 167.

In one embodiment, the system 100 performs a teach sequence to establish a baseline data set. In one embodiment, a baseline data set may be acquired for each semiconductor automation system when the system is installed or otherwise known to be in proper operating condition. In another embodiment, multiple baseline datasets may be acquired to look for normal variations in magnitude of conditions or timing. In one embodiment, the acquired sensor data may be examined manually via user interface to assure that the system is in the correct state. In another embodiment, the acquired sensor data may be examined by one or more algorithms executed by a computational system to assure that the system is in the correct state.

Figure 2:
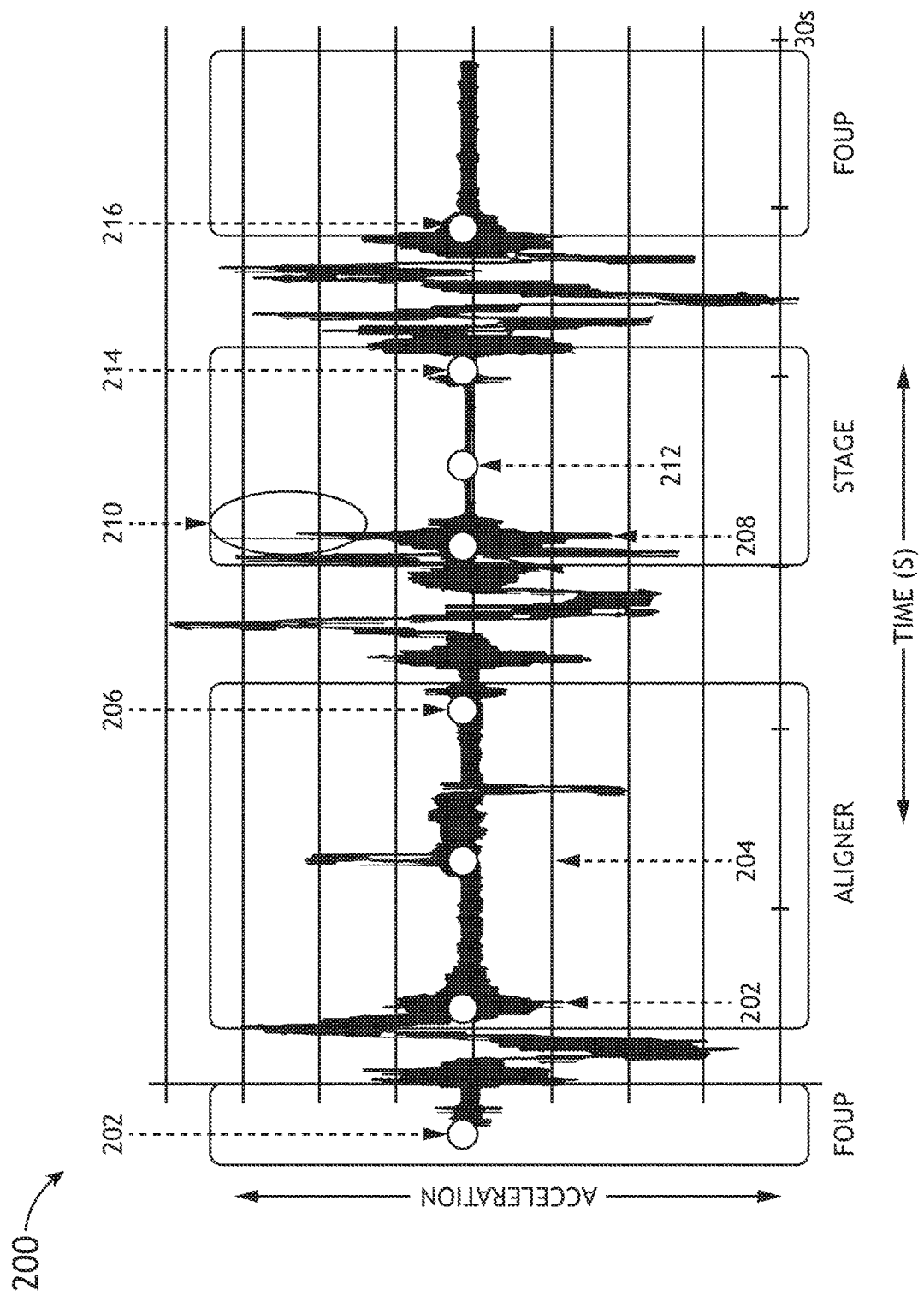
FIG. 2 is data graph depicting acceleration data measured by one or more sensors of the instrumented substrate as the instrumented substrate traversed one or more portions of a semiconductor fabrication facility, in accordance with one or more embodiments of the present disclosure.

FIG. 2 illustrates graph 200 depicting sensor data measured with the one or more sensors 111 of the instrumented substrate 110 used to perform a teach sequence, in accordance with one embodiment of the present disclosure. Graph 200 illustrates acceleration (measured with one or more motion sensors of the one or more sensors 111) as a function of time for tracking vibration experienced by the instrumented substrate 110 and, thus, product substrates.

In one embodiment, after the sensor data is acquired from the one or more sensors 111, the system 100 can display, via user interface 135, the sensor data along with other system information to enable a user to identify physical locations and critical activities. For example, one or more critical activities may include, but are not limited to, picking up the substrate 110 from the sealable container 120 by a robotic end effector. By way of another example, one or more critical activities may include, but are not limited to, placing the substrate 110 on a measurement stage. This and like information may be captured during the teach cycle and stored as teach data.

It is noted that the substrate 110 takes a physical path as it is moved through the equipment of semiconductor automation system and gather condition/parameter data associated with the movement (and other physical conditions) of the substrate via the one or more sensors 111. In one embodiment, the collected motion data (e.g., acceleration, time and/or gyroscope data) may be used to mathematically reconstruct the motion of the instrumented substrate 110. In another embodiment, the collected motion data (e.g., acceleration, time and/or gyroscope data) may be used to mathematically reconstruct the physical path of the instrumented substrate 110 through the semiconductor automation system. In turn, the constructed path may be displayed on the display of the user interface 135. In another embodiment, the areas along the constructed path may be labeled by the user, thereby providing geographical context for the location. In another embodiment, the motion of the instrumented substrate 110 may be labeled by the user, thereby providing mechanical context for the motion. It is noted that the understanding of the mechanical context of the motion of the instrumented substrate 110 aids in identifying various mechanism failures along the semiconductor fabrication automation system.

For example, as shown in FIG. 2, in the case of placement of a substrate onto an aligner, the user may label or tag this location as "ALIGNER." It is noted that a substrate aligner (e.g., semiconductor wafer aligner) acts to spin the substrate at high speed about an axis. The labeling of this area as ALIGNER allows for this area to be meaningfully noted in future events occurring at this location, compared with other similar aligners on other equipment, or compared to a theoretical model of how such an aligner should perform. It is noted that any number of areas along the constructed path may be labeled by the user. Additional areas include, but are not limited to, one or more sealable container or one or more substrate stages, which may be labeled as FOUP or STAGE respectively, as shown in FIG. 2.

In another embodiment, program instructions executed by the one or more processors 132 of server 130 may analyze the sensor data to observe changes in the state of the instrumented substrate 110, such as, but not limited to, directional changes registered by the one or more sensors 111 (e.g., accelerometer and/or gyroscope). In another embodiment, these changes in state can be automatically selected and highlighted by the server 130. In turn, the server 130 may transmit a request to label these changes of state to a user via the user interface 135. A series of potential changes of state are depicted in FIG. 2 and are labeled as 202, 204, 206, 208, 210, 212, 214, 216 and 218. These points correspond to different changes of state as the substrate 110 is removed from the sealable container, aligned, processed by the given process tool and then placed back into the sealable container 120. As shown in FIG. 2, point 202 corresponds to the substrate 110 being picked from the sealable container 120 (FOUP). Point 204 corresponds to the placement of the substrate 110 on the aligner. Point 206 corresponds to the start of the alignment of the substrate 110. Point 208 corresponds to the substrate 110 being picked from the aligner. Point 210 corresponds to the placement of the substrate 110 onto a stage. Point 212 corresponds to the execution of a process recipe. Point 214 corresponds to the substrate 110 being picked from the stage. Point 216 corresponds to the placement of the substrate 110 back into the sealable container 120.

It is noted herein that regular monitoring generates data streams which can be compared to the stored baseline either in real-time or offline. Additional data such as the physical location of the substrate 110 may be determined by sensors 111 and/or 121, such as gyroscope and accelerometer, and may be used to segment the new data and compare each segment with the corresponding segment from the known good baseline data. In another embodiment, the sensor data may be compared to one or more waveforms to identify the behavior of the given segment. For example, the measured sensor data may be compared to one or more simulated waveforms to identify the behavior of the given segment. By way of another example, the measured sensor data may be compared to a waveform from the sensors 111 and/or 121 when the instrument substrate 110 and/or sealable container 120 are in a proper or accepted operating state. By way of another example, the measured sensor data may be compared to a waveform obtained with sensors 111 and/or 121 when the instrument substrate 110 and/or sealable container 120 in an unacceptable operating state. In this regard, a waveform library may be generated, whereby the system 100 may collect waveforms from sensors 111 and/or 121 for various expected problems. In another embodiment, the segment may be compared to a set of segments of similar type across a number of pieces of equipment. For example, the waveform associated with an aligner may be compared to all (or a portion of) aligners in the semiconductor factory. In another embodiment, the data may be processed and the results compared to pre-selected thresholds (e.g., maximum deviations) or other markers derived from the sensor data.

Based on the information provided by the teach data, the implications of any deviation between the baseline and a later measurement can be interpreted to determine if there is a problem with one or more portions of the semiconductor automation system. It is further noted that the one or more processors 132 may identify possible errors in the handling of the substrate 110 as it moves from location to location. For example, point 218 in FIG. 2 may correspond to an error or problem when the substrate 110 was transferred to the stage. Once a deviation or possible problem has been identified the context data enables analysis to determine a likely root cause or causes of the given deviation. As the system is utilized new root causes may be uncovered by the user. An expert system approach may be utilized to capture these new root causes from the users and pattern recognition techniques may be used to recognize future occurrences of these root causes.

Figure 3:
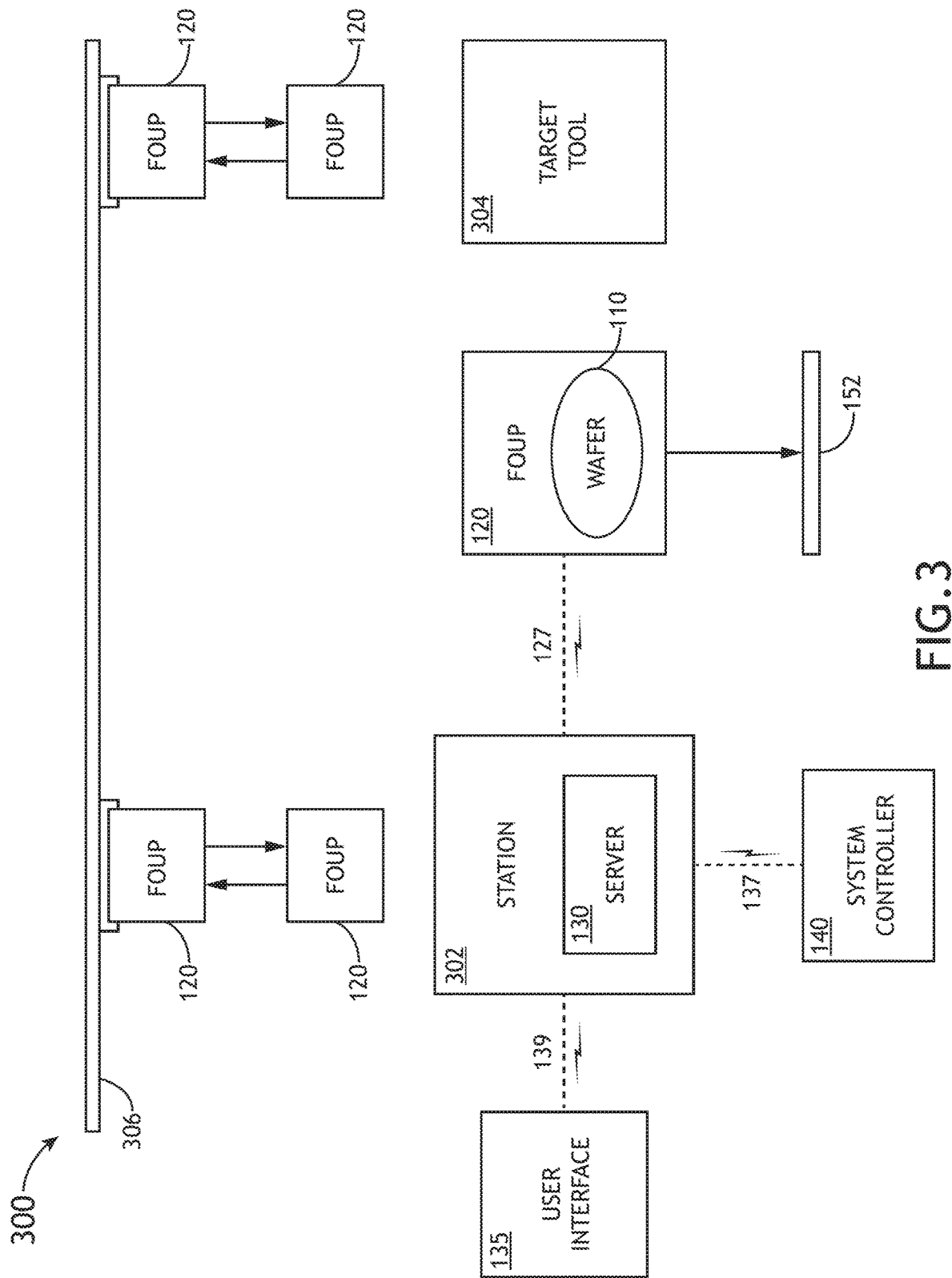
FIG. 3 is a block diagram view of the implementation of the system for measuring one or more conditions of the instrumented substrate within a semiconductor fabrication facility, in accordance with one or more embodiments of the present disclosure.

FIG. 3 illustrates system 100 implemented within a semiconductor factory 300, in accordance with one embodiment of the present disclosure. In this example, the instrumented substrate 110 is an instrumented wafer, the sealable container 120 is a FOUP and the system controller 140 is a MES. In one embodiment, the server 130 is integrated with station 302 of the semiconductor factory 300. In this regard, the server 130 of station 302 may analyze one or more portions of the semiconductor factory 300 by receiving one or more conditions of the instrumented wafer 110 (from the sensors 111) or the FOUP 120 (from sensors 121), which may be transmitted to the server 130 via datalink 127. In another embodiment, the server 130 may analyze the operation of one or more automation systems of the semiconductor factory 300 by analyzing one or more measured conditions of the instrumented wafer 110 or the FOUP 120 as the automation system(s) move the FOUP 120 along a physical path of the semiconductor factory. As noted, the automation system(s) may include, but are not limited to, automated material handling systems (e.g., OHT, stocker), FOUP/wafer handling systems of process and metrology equipment. For instance, as shown in FIG. 3, the OHT 306 may pick the FOUP 120 from station 302 and transport the FOUP 120 to the target tool 304. As the FOUP 120 is transported through the semiconductor factory 300, the instrumented wafer 110 and/or the FOUP 120 may measure and track one or more conditions of the instrumented wafer 110 and/or the FOUP 120, such as, but not limited to, the leveling, teaching, alignment, cleanliness, pressure, and health of one or more semiconductor factory automation systems. It is noted that in order to accomplish the most relevant results the test instrument substrate 110 is moved through the factory 300 in the same way that product wafers move through the factory. In another embodiment, one or more container chargers 152 may be distributed throughout the factory 300 to charge the FOUP 120 at these various locations.

To integrate system 100 into the semiconductor factory system 300 a sequence of operations may be carried out. In one embodiment, a scheme may be utilized where the instrumented substrates 110 appear to be standard metrology equipment in the factory system. It is noted that standard equipment may communicate with the factory system controller 140 (e.g., one or more MES servers 140) according to a selected communications protocol. For example, the selected communications protocol may include an industry standard communications protocol consistent with standards defined by the Semiconductor Equipment and Materials Institute (SEMI). These standards are referred to as SEMI Equipment Communications Standards (SECS) and Generic Equipment Model (GEM).

In one embodiment, the one or more servers 130 of system 100 may connect to the system controller (e.g., MES) and interact with the system controller 140 as if it were measurement equipment. The server 130, which is integrated with the automated metrology station 302, may interface with the instrumented wafer 110 and/or the FOUP 120 to establish the parameters of a measurement mission and gather the results. Once the results are gathered by the server, the FOUP 120 or the instrumented wafer 110 may determine that an exception case has occurred. This exception may be reported to the system controller 140 (e.g., MES) as a warning or as an alarm. In another embodiment, the system server 130 may directly communicate with other factory systems and users via methods such as, but not limited to, web-based graphical user interfaces, mobile devices, text messages, or emails.

Figure 4A:
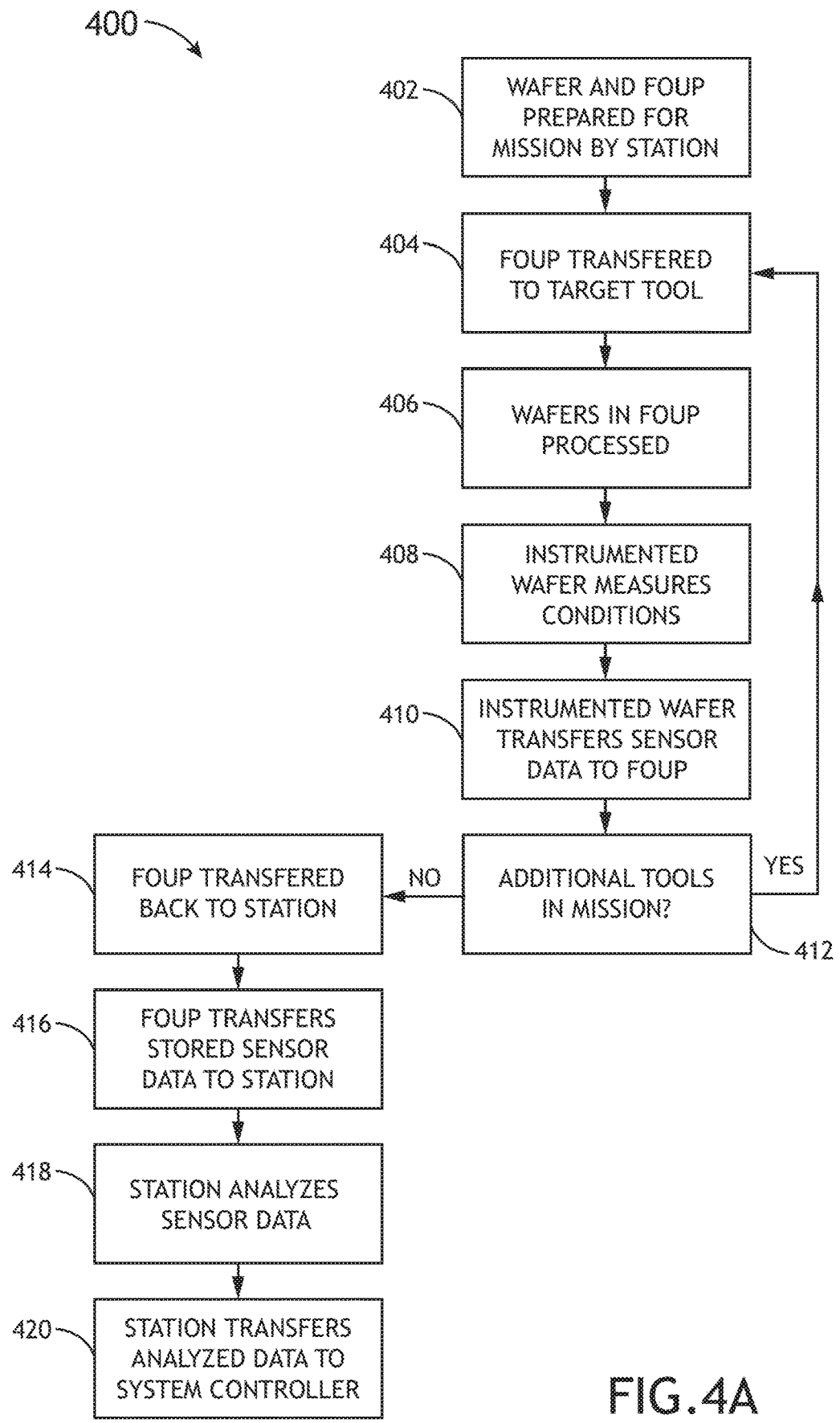
FIG. 4A is process flow diagram depicting a method of measuring one or more conditions of an instrumented substrate as the instrumented substrate traverses one or more portions of a semiconductor fabrication facility, in accordance with one or more embodiments of the present disclosure.

FIG. 4 illustrates a process flow diagram 400 depicting a set of steps 400 carried out by the system 100 when monitoring a target tool 304 of a semiconductor factory, in accordance with one embodiment of the present disclosure. In step 402, the instrumented wafer 110 and the FOUP 120 are prepared for a mission by the server 130 of station 302. For example, a measurement recipe may be loaded onto the instrumented wafer 110. It is noted that the server 130 may act as a proxy measurement instrument in the semiconductor factory 300 for all the metrology instruments gathering data.

In step 404, the FOUP 120 is transferred from the station 302 to the target tool 304. For example, the OHT 306 may pick the FOUP 120 from the station 302 and transport the FOUP 120 to the target tool 304 (e.g., etcher). In step 406, the product wafers contained in the FOUP 120 are processed by the target tool 304. For example, in the case of an etcher, the etcher may apply a selected etcher recipe (e.g., Etcher PM recipe). In step 408, while the target tool 304 processes the product wafers, the instrumented wafer 110 measures one or more conditions of the instrumented wafer 110. For example, the instrumented wafer 110 may measure one or more conditions of the instrumented wafer 110 via sensors 111 (shown in FIG. 1B). Further, the FOUP 120 may measure one or more conditions of the FOUP 120 or the wafer 111 via sensors 121 (shown in FIG. 1B). In step 410, the measured sensor data of step 408 is transmitted to the server 130. For example, the measured sensor data may be transferred from the instrumented wafer 110 to the FOUP 120. In turn, the FOUP 120 may transfer the measured sensor data to the server 130. By way of another example, the measured sensor data may be transferred directly from the instrumented wafer 110 to the server 130. In addition, the measurement context may be provided with the sensor data. For example, in the case of an etcher, the sensor data may be correlated on the server 130 with Etcher 1 using Etcher PM recipe. The server can use these tags and the parameters of a stored recipe to compare the resulting data to baseline or other data.

In step 412, it is determined if additional tools are to be measured in the mission. In the case where additional tools should be measured, the process 400 moves back to step 404 and steps 404-412 are repeated. For example, following measurement of the first target tool 304 (e.g., first etcher), the OHT 306 may transport the FOUP 120 to a second target tool (e.g., second etcher). It is further noted that a batch of one or more instrumented wafers 110 may be issued as a "lot" to follow this test process, thereby triggering measurement of the two target tools (e.g., etchers) and interpretation of the data.

In step 414, the FOUP 120 is transferred back to the station 302. In step 416, the FOUP 120 may transfer sensor data from the FOUP 120 to the station 302. For example, the FOUP 120 may transfer sensor data from the FOUP 120 to the server 130 of station 302. In step 418, the station 302 analyzes the sensor data received from the FOUP 120. For example, the server 130 of station 302 analyzes the sensor data received from the FOUP 120. For instance, any of the analysis techniques described previously herein may be used to analyze the sensor data. In step 420, the station 302 transfers the analyzed data to the system controller 140. For example, the server 130 of station 302 may transfer the analyzed data to the system controller 140. In the event the analysis of the sensor data identifies a problem, then an alarm or warning message may be sent to the host, independent of the mission and job. Further, the text of the alarm may identify the location of the problem, indicator of detected symptoms, and an estimate of the root cause. For example, a textual report, such as that depicted in FIG. 4B may be provided to a user via user interface 135.

It is noted herein that some components of the semiconductor factory 300 may be better analyzed by a segment-type analysis. For example, the transport components (e.g., OHT) that transport material around the factory may be measured and the vibration data and/or other data may be analyzed with the computed physical location data based on motion sensor data (e.g., accelerometer data, magnetometer data and gyroscope data). Deviations that can be identified as systemic track problems may be physically located using the sensor data. In addition, deviations that follow the transport component may also be identified. It is noted herein that basic moves, such as left, right straight, hoist up and hoist down, may be categorized accordingly and analyzed by comparing the measured sensor data to a baseline or set point for that type of segment.

All of the methods described herein may include storing results of one or more steps of the method embodiments in the memory. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the disclosure is defined by the appended claims.

What is claimed is:

1. A system for measuring and monitoring one or more conditions of an automation system of a semiconductor factory comprising:

one or more instrumented substrates, wherein the one or more instrumented substrates include one or more sensors configured to measure one or more conditions of the one or more instrumented substrates as the one or more instrumented substrates traverse one or more portions of the semiconductor factory, wherein the one or more instrumented substrates include substrate communication circuitry and one or more processors communicatively coupled to the one or more sensors and the substrate communication circuitry, wherein the one or more instrumented substrates include power supply circuitry;

one or more sealable containers configured to transport the one or more instrumented substrates through the semiconductor factory, wherein the one or more sealable containers include container communication circuitry configured to receive sensor data from the one or more sensors of the one or more instrumented substrates via the substrate communication circuitry; and one or more system servers, wherein the one or more system servers include server communication circuitry communicatively couplable to the one or more sealable containers and configured to receive the sensor data from the container communication circuitry, wherein the one or more system servers are further configured to determine a physical path of the one or more instrumented substrates through the semiconductor factory based on acceleration data, gyroscope data, and time data from the one or more sensors and a time of measurement of the acceleration data and gyroscope data, wherein the one or more system servers are configured to segment the sensor data into a plurality of segments based on the acceleration data and gyroscope data and compare each segment with a corresponding segment from the baseline data to identify one or more changes in the state of the one or more instrumented substrates, wherein the one or more system servers are configured to automatically select the one or more changes in state of the one or more instrumented substrates and transmit a request to label the one or more changes of state to a user via a user interface.

2. The system of claim 1, wherein the one or more portions of the semiconductor fabrication facility traversed by the one or more instrumented substrates comprise:
at least one of one or more process tools or one or more metrology tools.

3. The system of claim 1, further comprising:
a system controller communicatively coupled to the one or more system servers, wherein the system controller includes one or more processors, wherein the one or more processors are configured to execute program instructions configured to cause the one or more processors to load a measurement recipe onto the one or more instrumented substrates.

4. The system of claim 1, wherein the system controller comprises:
a manufacturing execution system (MES).

5. The system of claim 1, wherein the one or more instrumented substrates comprise:
one or more instrumented semiconductor wafers.

6. The system of claim 1, wherein at least one of the one or more sensors, the substrate communication circuitry, or the one or more processors are disposed on a surface of the one or more instrumented substrates.

7. The system of claim 1, wherein at least one of the one or more sensors, the substrate communication circuitry, or the one or more processors are disposed within the one or more instrumented substrates.

8. The system of claim 1, wherein the one or more sensors comprise:
at least one of one or more motion sensors, one or more gas sensors, one or more humidity sensors, one or more contamination sensors, one or more chemical sensors, one or more pressure sensors, or one or more temperature sensors.

9. The system of claim 1, wherein the substrate communication circuitry and the container communication circuitry are communicatively couplable via a wireless datalink.

10. The system of claim 1, wherein the substrate communication circuitry and the container communication circuitry are communicatively couplable via a transmission line.

11. The system of claim 1, wherein the power supply circuitry includes at least one of one or more rechargeable batteries or one or more replaceable batteries.

12. The system of claim 1, wherein the container communication circuitry and the server communication circuitry are communicatively couplable via a wireless datalink.

13. The system of claim 1, wherein the container communication circuitry and the server communication circuitry are communicatively couplable via a transmission line.

14. The system of claim 1, wherein the sealable container includes power supply circuitry.

15. The system of claim 14, wherein the power supply circuitry of the sealable container includes one or more wireless chargers.

16. The system of claim 14, wherein the one or more wireless chargers of the sealable container include one or more radio frequency receiving coils inductively couplable to at least one of a set of radio frequency transmission coils of a charging station.

17. The system of claim 14, wherein the power supply circuitry of the one or more sealable containers includes at least one of one or more rechargeable batteries or one or more replaceable batteries.

18. The system of claim 1, wherein the sealable container comprises:
a front opening unified pod (FOUP).

19. The system of claim 1, wherein determining the physical path of the one or more instrumented substrates within the semiconductor factory based on the one or more identified critical activities comprises:
transmitting, to a user interface, one or more requests to a user interface for physical location labels indicative of the one or more locations of the one or more instrumented substrates within the semiconductor factory;
receiving, from the user interface, one or more physical location labels associated with one or more critical activities.

20. The system of claim 1, wherein the one or more system servers are further configured to generate a waveform library based on the one or more identified critical activities, the waveform library including one or more waveforms based on sensor data from the one or more instrumented substrates.

21. The system of claim 1, wherein the one or more sealable containers act as one or more data repeaters to immediately transfer sensor data from the one or more instrumented wafers to the one or more system servers.

22. The system of claim 1, wherein the one or more system servers are configured to identify one or more critical activities of the one or more instrumented substrates based on sensor data from the one or more instrumented substrates, wherein the one or more critical activities include at least one of picking up of the one or more instrumented substrates or placement of the one or more instrumented substrates.

23. A system for measuring and monitoring one or more conditions of an automation system of a semiconductor factory comprising:
one or more instrumented substrates, wherein the one or more instrumented substrates include one or more sensors configured to measure one or more conditions of the one or more instrumented substrates as the one or more instrumented substrates traverse one or more portions of the semiconductor factory, wherein the one or more instrumented substrates include substrate communication circuitry and one or more processors communicatively coupled to the one or more sensors and the substrate communication circuitry, wherein the one or more instrumented substrates include power supply circuitry;
one or more sealable containers configured to transport the one or more instrumented substrates through the semiconductor factory, wherein the one or more sealable containers include container communication circuitry configured to receive sensor data from the one or more sensors of the one or more instrumented substrates via the substrate communication circuitry;
one or more system servers, wherein the one or more system servers include server communication circuitry communicatively couplable to the one or more sealable containers and configured to receive the sensor data from the container communication circuitry, wherein the one or more system servers are further configured to determine a physical path of the one or more instrumented substrates through the semiconductor factory based on acceleration data and gyroscope data from the one or more sensors and a time of measurement of the acceleration data and gyroscope data, wherein the one or more system servers are configured to segment the sensor data into a plurality of segments based on the acceleration data and gyroscope data and compare each segment with a corresponding segment from the baseline data to identify one or more changes in the state of the one or more instrumented substrates;
a system controller, wherein the system controller is communicatively coupled to the one or more system servers and receives analyzed data from the one or more system servers; and
a user interface, wherein the user interface is configured to display sensor data from the one or more sensors, wherein the one or more system servers are configured to automatically select the one or more changes in state of the one or more instrumented substrates and transmit a request to label the one or more changes of state to a user via the user interface.

24. A system for measuring and monitoring one or more conditions of an automation system of a semiconductor factory comprising:
one or more instrumented substrates, wherein the one or more instrumented substrates comprise:
one or more sensors configured to measure one or more conditions of the one or more instrumented substrates as the one or more instrumented substrates traverse one or more portions of the semiconductor factory;
substrate communication circuitry;
one or more processors communicatively coupled to the one or more sensors and the substrate communication circuitry; and
power supply circuitry including one or more radio frequency receiving coils;
one or more sealable containers configured to transport the one or more instrumented substrates through the semiconductor factory, the one or more sealable containers comprising:
container communication circuitry configured to receive sensor data from the one or more sensors of the one or more instrumented substrates via the substrate communication circuitry;
an external power transfer device including a circular array of one or more radio frequency transmission coils and one or more coil controllers communicatively coupled to the array of one or more radio frequency transmission coils, wherein the one or more coil controllers are configured to identify one or more inductive loads indicative of a coupling between the one or more radio frequency receiving coils and the one or more radio frequency transmission coils, and transfer power to the power supply circuitry of the one or more instrumented substrates via a radio frequency transmission coil associated with an identified inductive load of the one or more identified inductive loads; and
one or more system servers comprising server communication circuitry communicatively couplable to the one or more sealable containers, wherein the server communication circuitry is configured to receive the sensor data from the container communication circuitry, wherein the one or more system servers are further configured to determine a physical path of the one or more instrumented substrates through the semiconductor factory based on acceleration data and gyroscope data from the one or more sensors and a time of measurement of the acceleration data and gyroscope data, wherein the one or more system servers are configured to segment the sensor data into a plurality of segments based on the acceleration data and gyroscope data and compare each segment with a corresponding segment from the baseline data to identify one or more changes in the state of the one or more instrumented substrates, wherein the one or more system servers are configured to automatically select the one or more changes in state of the one or more instrumented substrates and transmit a request to label the one or more changes of state to a user via a user interface.

25. The system of claim 24, wherein identifying one or more inductive loads indicative of a coupling between the one or more radio frequency receiving coils and the one or more radio frequency transmission coils comprises:
transmitting one or more request signals, from the one or more coil controllers, to the circular array of one or more radio frequency transmission coils; and
receiving, with the one or more coil controllers, an inductive load metric associated with at least one radio frequency transmission coil of the array of one or more radio frequency transmission coils.

* * * * *